(12) United States Patent
Jhan et al.

(10) Patent No.: US 12,068,316 B2
(45) Date of Patent: Aug. 20, 2024

(54) SEMICONDUCTOR DEVICE AND METHOD OF FORMING THE SAME

(71) Applicant: Fujian Jinhua Integrated Circuit Co., Ltd., Quanzhou (CN)

(72) Inventors: Yi-Wang Jhan, Taichung (TW); Fu-Che Lee, Taichung (TW); Huixian Lai, Quanzhou (CN); Yu-Cheng Tung, Kaohsiung (TW); An-Chi Liu, Tainan (TW); Gang-Yi Lin, Taitung County (TW)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 210 days.

(21) Appl. No.: 17/388,005

(22) Filed: Jul. 29, 2021

(65) Prior Publication Data

US 2022/0384431 A1     Dec. 1, 2022

(30) Foreign Application Priority Data

May 28, 2021 (CN) .......................... 202110591903.1
May 28, 2021 (CN) .......................... 202121180640.7

(51) Int. Cl.
| | |
|---|---|
| *H01L 27/088* | (2006.01) |
| *H01L 21/8234* | (2006.01) |
| *H01L 29/423* | (2006.01) |
| *H01L 29/51* | (2006.01) |
| *H01L 29/78* | (2006.01) |

(52) U.S. Cl.
CPC .. *H01L 27/0886* (2013.01); *H01L 21/823431* (2013.01); *H01L 21/823481* (2013.01); *H01L 29/42368* (2013.01); *H01L 29/511* (2013.01); *H01L 29/7842* (2013.01)

(58) Field of Classification Search
CPC ............. H01L 27/0886; H01L 29/7842; H01L 29/42368; H01L 21/823431; H01L 21/823481
See application file for complete search history.

(56) References Cited

U.S. PATENT DOCUMENTS

| | | | | |
|---|---|---|---|---|
| 8,809,947 B1 * | 8/2014 | Akarvardar | ........... | H01L 29/785 438/269 |
| 8,878,299 B2 * | 11/2014 | Lee | ........ | H01L 29/785 257/66 |
| 9,514,990 B2 | 12/2016 | Liu et al. | | |
| 10,431,679 B2 | 10/2019 | Chang | | |

(Continued)

FOREIGN PATENT DOCUMENTS

| | | |
|---|---|---|
| CN | 104412389 A | 3/2015 |
| CN | 108962892 A | 12/2018 |

*Primary Examiner* — Tuan A Hoang
(74) *Attorney, Agent, or Firm* — Winston Hsu

(57) ABSTRACT

The present disclosure relates to a semiconductor device and a method of forming the same, and the semiconductor device includes a substrate, a gate line and a stress layer. The substrate has a plurality of first fins protruded from the substrate. The gate line is disposed over the substrate, across the first fins, to further include a gate electrode and a gate dielectric layer, wherein the dielectric layer is disposed between the gate electrode layer and the first fins. The stress layer is disposed only on lateral surfaces of the first fins and on a top surface of the substrate, wherein a material of the stress layer is different from a material of the first fins.

8 Claims, 15 Drawing Sheets

(56) References Cited

U.S. PATENT DOCUMENTS

| | | | | |
|---|---|---|---|---|
| 2010/0252816 A1* | 10/2010 | Ko | ...................... | H01L 29/8124 |
| | | | | 257/E29.264 |
| 2014/0027816 A1* | 1/2014 | Cea | ..................... | H01L 29/1054 |
| | | | | 257/E29.085 |
| 2019/0035917 A1* | 1/2019 | Cheng | ................... | H01L 29/401 |
| 2020/0395250 A1 | 12/2020 | Cheng | | |

* cited by examiner

SEMICONDUCTOR DEVICE AND METHOD OF FORMING THE SAME

BACKGROUND OF THE INVENTION

1. Field of the Invention

The present disclosure generally relates to a semiconductor device and a forming method thereof, and more particularly to a semiconductor memory device and a forming method thereof.

2. Description of the Prior Art

For years the trend in the memory industry as well as the semiconductor industry has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performances. In general, the DRAM cells with a buried gate include a transistor device and a charge storage device, which is able to accept signals from a bit line and a word line during the operation. However, due to limitations in fabrication technologies, many defects are formed in the DRAM cell with the buried gate.

SUMMARY OF THE INVENTION

One object of the present disclosure is to provide a semiconductor device and a method of forming the same, in which, a germanium-containing layer for example including germanium (Ge), silicon germanium (SiGe), germanium oxide ($GeO_x$), silicon germanium oxide ($SiGeO_x$), or the like is disposed on lateral surfaces of fins, to provide proper stress as well as improved lattice structure to the channel of the device. Thus, the channel of the semiconductor device in the present disclosure may therefore obtain better electron-mobility.

To achieve the purpose described above, one embodiment of the present disclosure provides a semiconductor device including a substrate, a gate line and a stress layer. The substrate has a plurality of first fins protruded from the substrate. The gate line is disposed over the substrate, across the first fins, to further include a gate electrode and a gate dielectric layer, wherein the dielectric layer is disposed between the gate electrode layer and the first fins. The stress layer is disposed only on lateral surfaces of the first fins and on a top surface of the substrate, wherein a material of the stress layer is different from a material of the first fins.

To achieve the purpose described above, another embodiment of the present disclosure provides a method of forming semiconductor device including the following steps. Firstly, a substrate is provided and the substrate has a plurality of first fins protruded from the substrate. Next, a stress layer is formed only on lateral surfaces of the first fins and on a top surface of the substrate, wherein a material of the stress layer is different from a material of the first fins. Then, a gate line is formed across the first fins, over the substrate, and the gate line includes a gate electrode and a gate dielectric layer, wherein the dielectric layer is disposed between the gate electrode layer and the first fins.

To achieve the purpose described above, another embodiment of the present disclosure provides a semiconductor device including a substrate and a gate line. The substrate has a plurality of first fins protruded therefrom, and the gate line is disposed across the first fins, over the substrate. The gate line includes agate electrode layer, and a gate dielectric layer between the gate electrode layer and the first fins, wherein the gate dielectric layer comprises a first portion and a second portion, the first portion is disposed on top surfaces of the first fins, and the second portion is disposed on lateral surfaces of the first fins and comprises silicon germanium oxide or germanium oxide.

In summary, the semiconductor device of the present disclosure further includes a germanium-containing layer disposed on lateral surfaces of fins, and a gate line crosses over the fins, with the germanium-containing layer creating a proper stress and better lattice structure to the channel of the semiconductor device, thus that, the semiconductor device may therefore obtain improved high-electron-mobility. The germanium-containing layer for example includes Ge, SiGe, $GeO_x$, $SiGeO_x$, or other suitable material. In this way, the semiconductor device of the present disclosure is allowable to gain better functions and performances.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 11 are schematic diagrams illustrating a method of forming a semiconductor device according to a first preferred embodiment of the present disclosure, in which:

FIG. 1 shows a top view of a semiconductor device after forming active areas;

FIG. 2 shows a cross-sectional view taken along a cross line A-A' in FIG. 1;

FIG. 3 shows a cross-sectional view of a semiconductor device after forming a stress layer;

FIG. 4 shows a cross-sectional view of a semiconductor device after forming a shallow trench isolation;

FIG. 5 shows a top view of a semiconductor device after forming a trench;

FIG. 6 shows a cross-sectional view taken along a cross line A-A' in FIG. 5;

FIG. 7 shows a cross-sectional view taken along a cross line B-B' in FIG. 5;

FIG. 8 shows a cross-sectional view of a semiconductor device after performing an oxidation process;

FIG. 9 shows a top view of a semiconductor device after forming a gate line;

FIG. 10 shows a cross-sectional view taken along a cross line A-A' in FIG. 9; and FIG. 11 shows a cross-sectional view taken along a cross line B-B' in FIG. 9.

FIGS. 12-13 are schematic diagrams illustrating a method of forming a semiconductor device according to a second preferred embodiment of the present disclosure, in which:

FIG. 12 shows a cross-sectional view of a semiconductor device after forming a shallow trench isolation; and FIG. 13 shows a cross-sectional view of a semiconductor device after forming a trench.

DETAILED DESCRIPTION

For better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
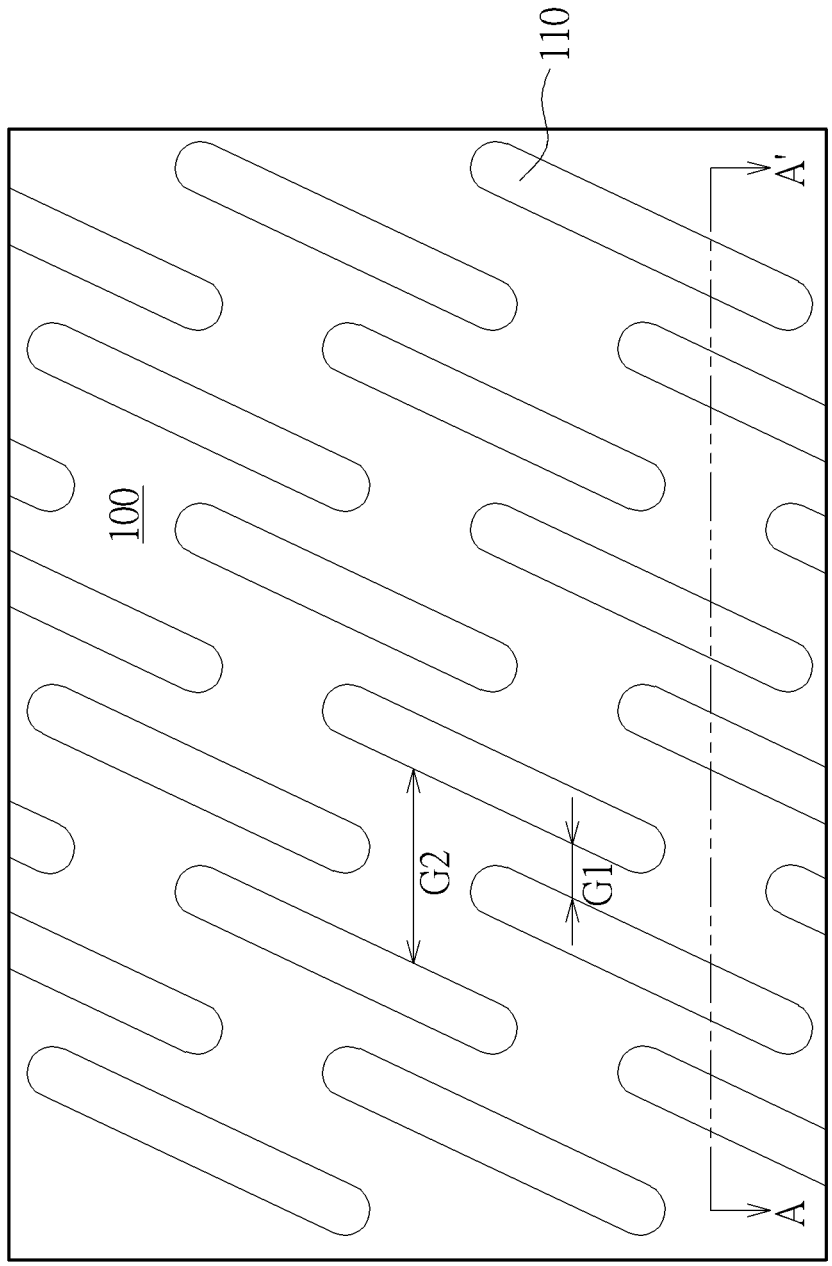
Figure 2:
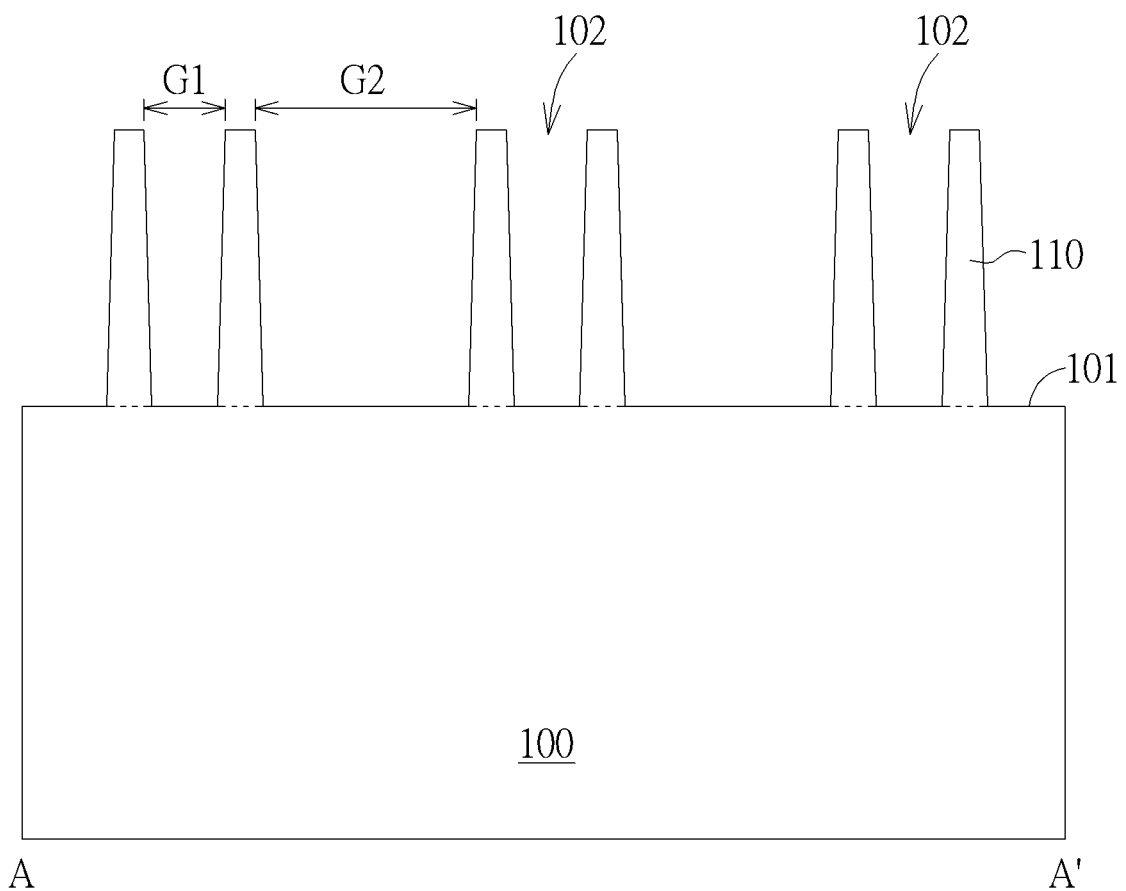
Figure 3:
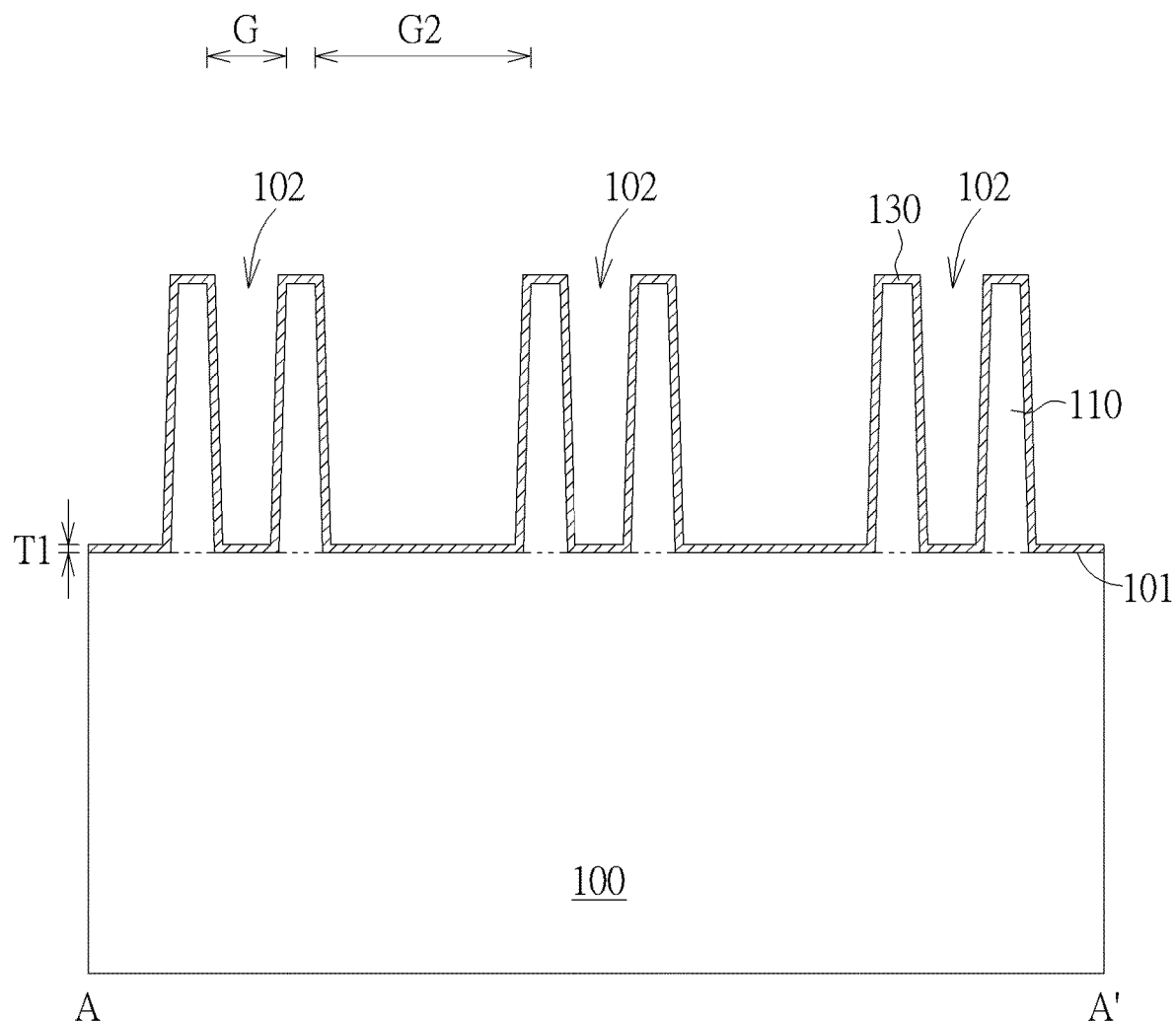
Figure 4:
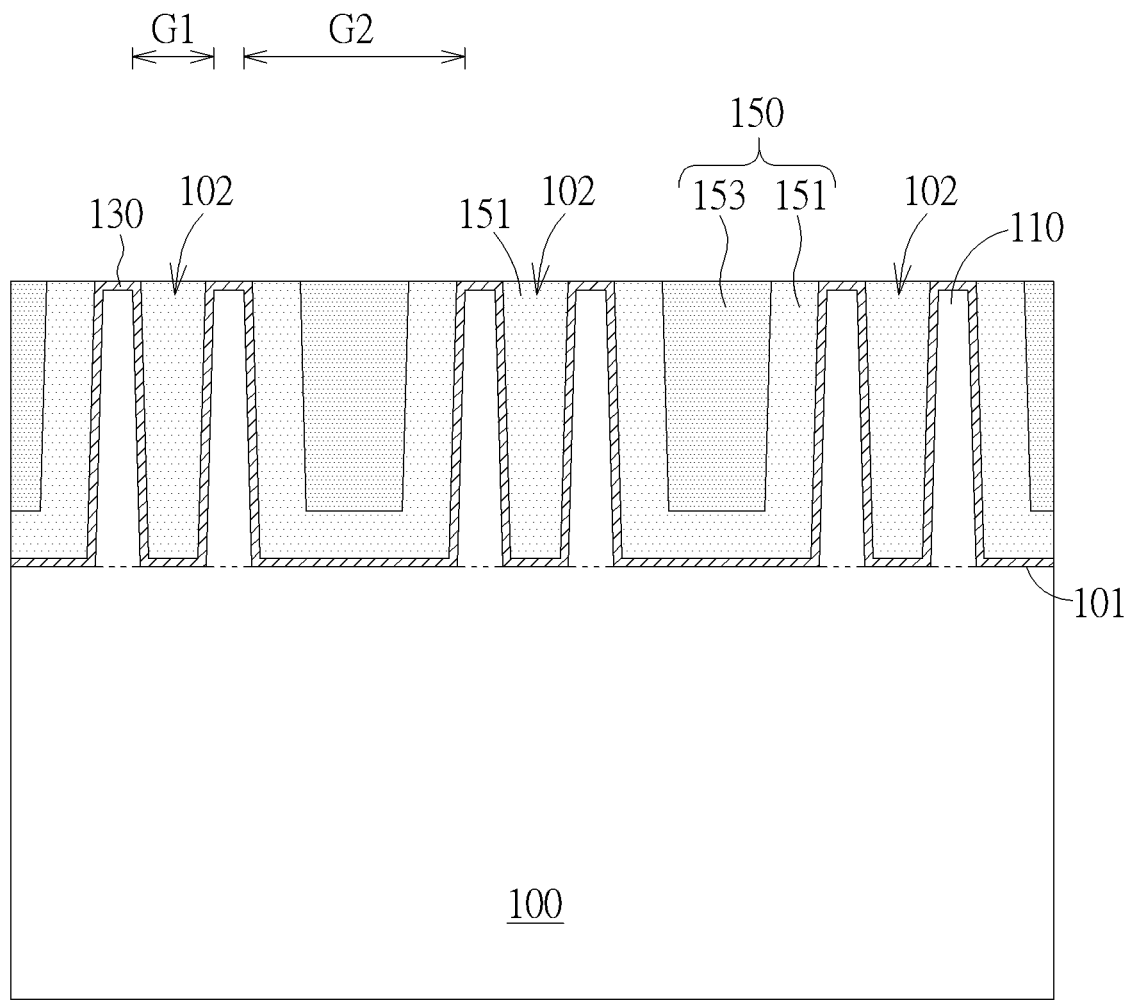
Figure 5:
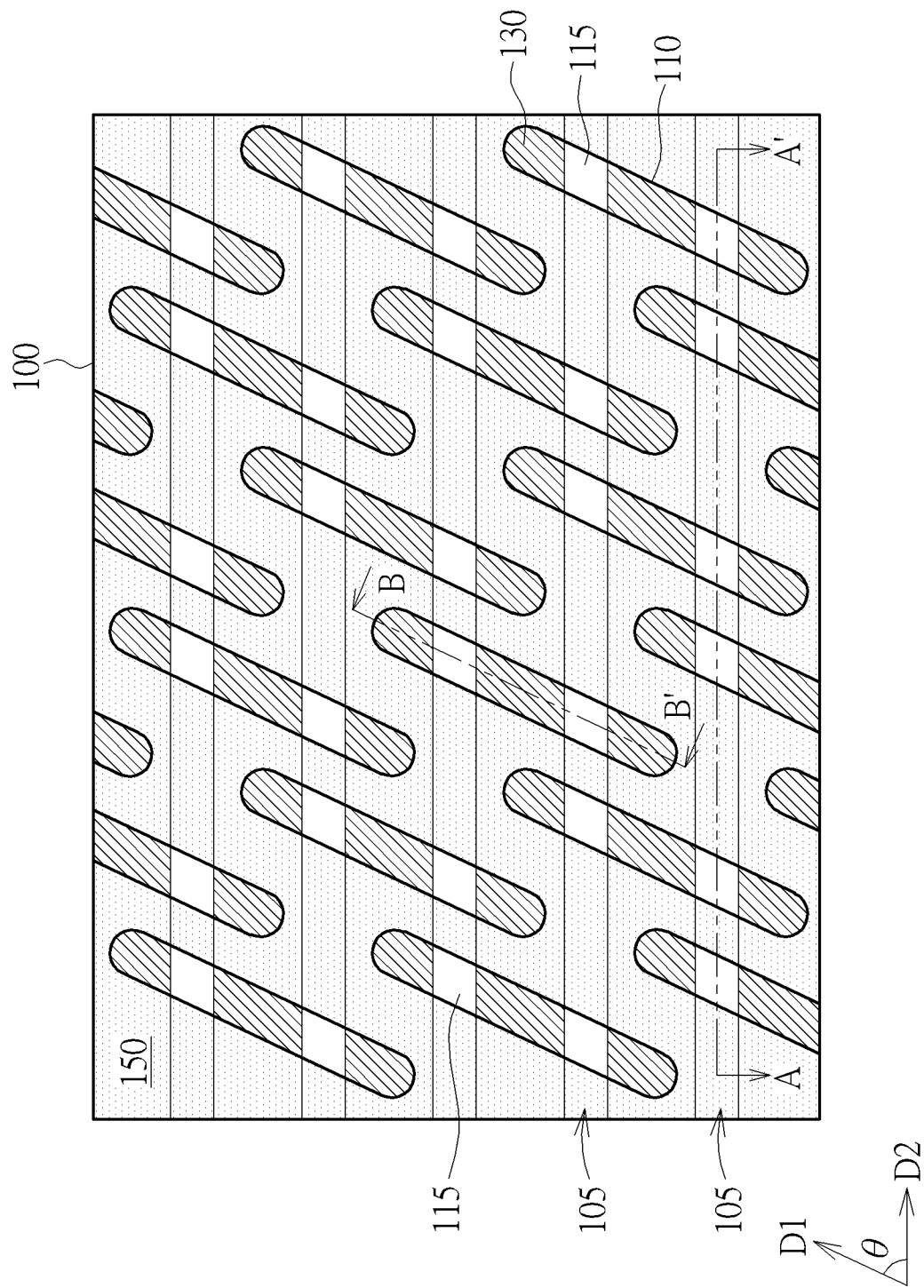
Figure 7:
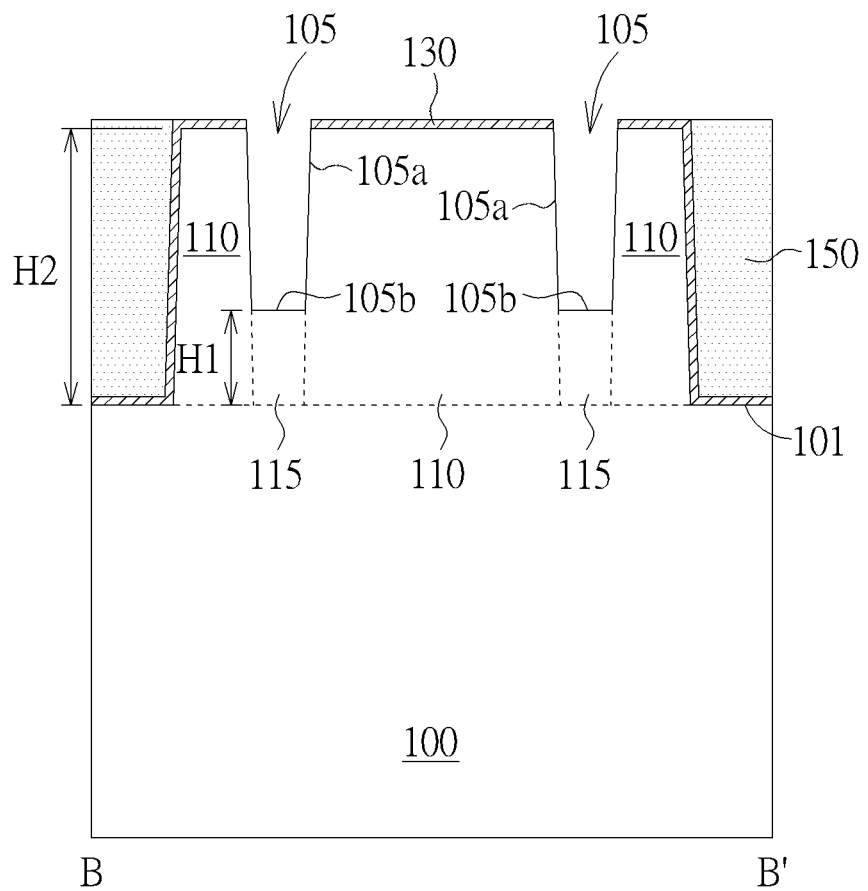
Figure 8:
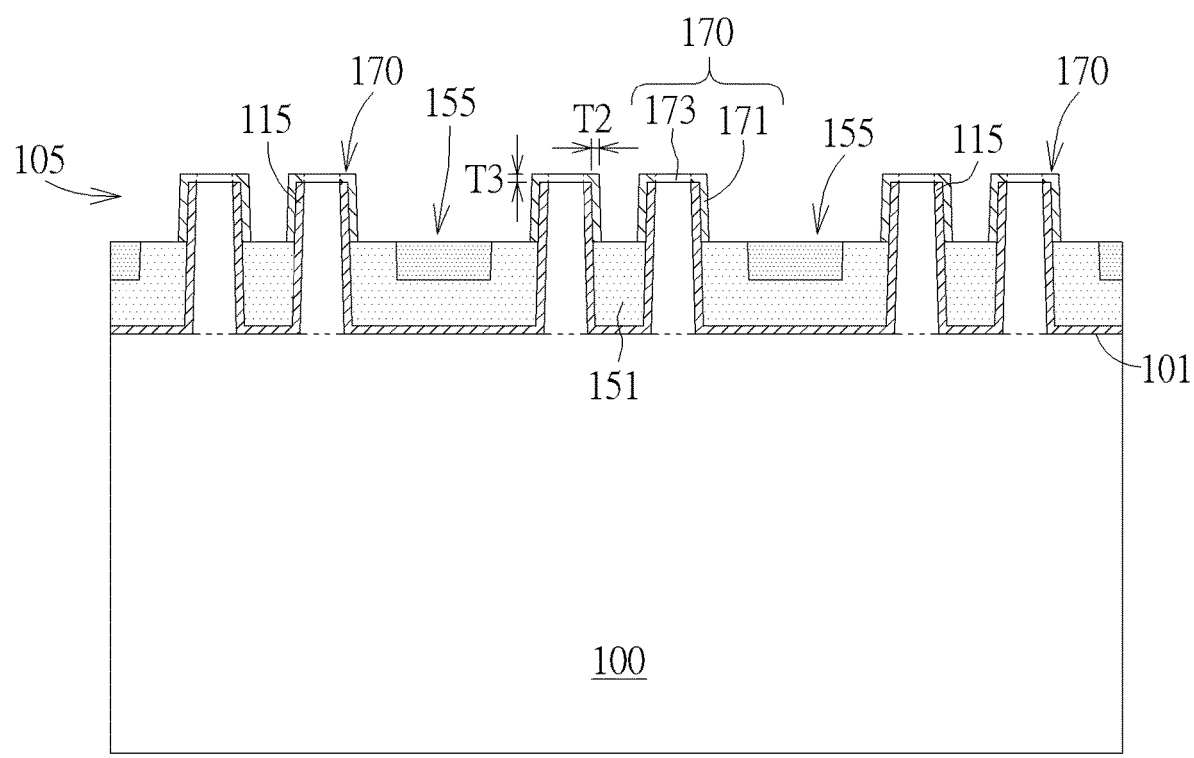
Figure 9:
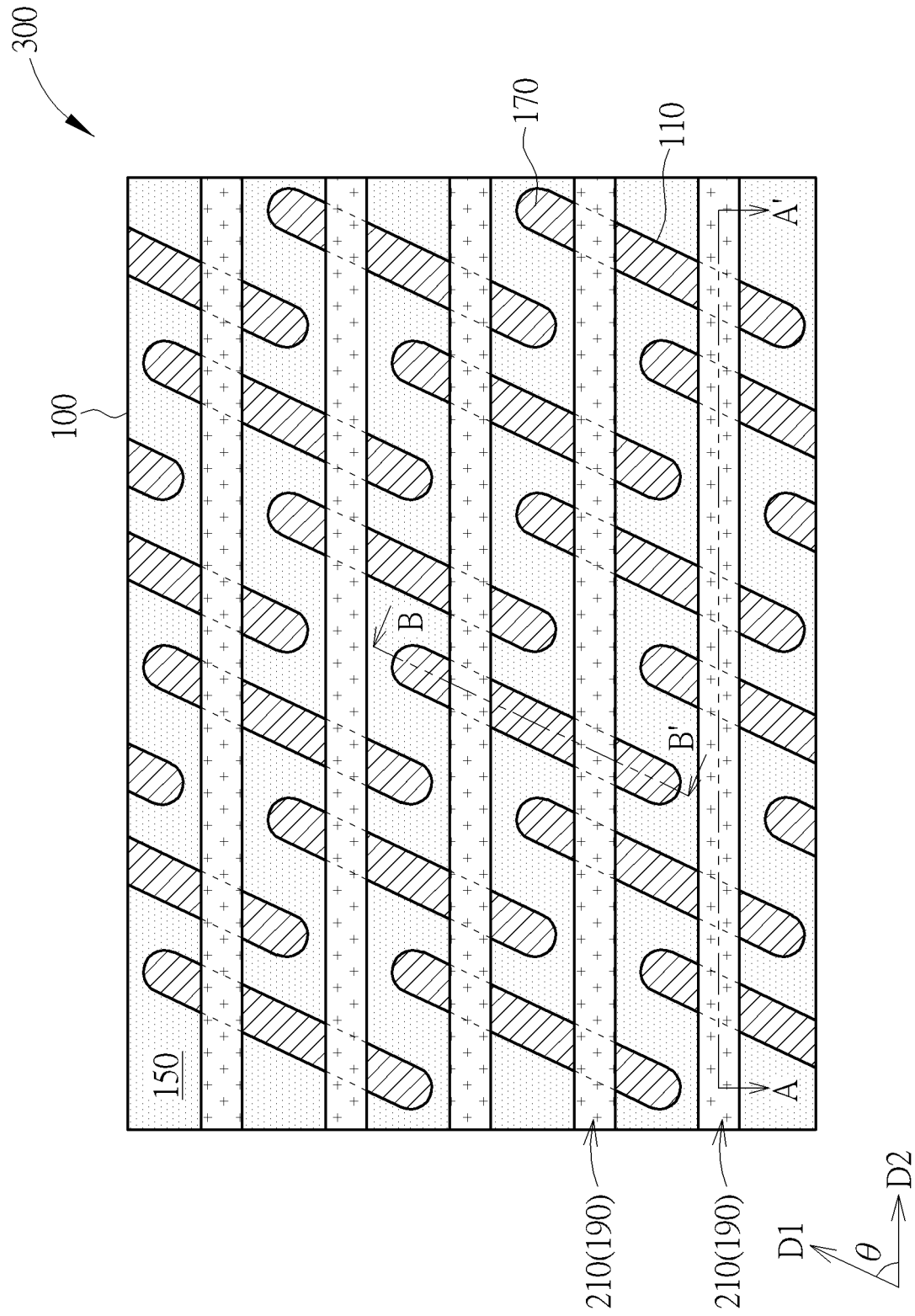

Please refer to FIGS. 1-11, which illustrate a method of forming a semiconductor device according to a preferred embodiment of the present disclosure, wherein FIGS. 1, 5, 9 respectively show a top view of a semiconductor device during the forming processes, and other drawings respectively show a cross-sectional view during the forming processes. Firstly, as shown in FIGS. 1-2, a substrate 100 such as a silicon substrate or a silicon-containing substrate is provided, and a plurality of fins 110 is formed on the substrate 100, with each of the fins 110 being protruded from a top surface 101 of the substrate 100. In other words, although the fins 110 and the substrate 100 are monolithic, the top surface 101 of the substrate 100 may be regarded as the interface (such as the dotted line shown in FIG. 1) between the fins 110 and the substrate 100.

In one embodiment, the fins 110 may be formed through a self-aligned double patterning (SADP) process or a self-aligned reverse double patterning (SARP) process, in which a plurality of mandrels (not shown in the drawings) is firstly formed on a bulk silicon substrate (not shown in the drawings) by using a photolithography and an etching process, a spacer (not shown in the drawings) is then formed on the sidewall of each of the mandrels, and the mandrels are removed and the spacer is used as a mask to pattern the bulk silicon substrate, thereby forming a plurality of trenches 102 as shown in FIG. 2 to simultaneously define the fins 110. Alternatively, the formation of the fins 110 may also be accomplished by firstly forming a patterned mask (not shown in the drawings) on the substrate 100 to partially cover the top surface 101 of the substrate 100, followed by performing an epitaxial process on the substrate 100 through the patterned mask, thereby forming a semiconductor layer (not shown in the drawings) on the exposed top surface 101 of the substrate 100, with the semiconductor layer being used as corresponding fins.

In one embodiment, each of the fins 110 is preferably parallel with each other and extends along a direction D1 through a top view as shown in FIG. 1, with the direction D1 having an included angle θ with the x-direction or the y-direction (such as a direction D2 as shown in FIG. 1), but is not limited thereto. Also, as shown in FIGS. 1-2, the trenches 102 may include various diameters G1/G2 in the direction D2, such that, a part of the fins 110 may be spaced from other by a relative smaller distance G1 and another part of the fins 110 may be spaced from other by a relative greater distance G2. However, in another embodiment, each of the fins may also be spaced from others by the same distance (not shown in the drawings) due to practical product requirements.

As shown in FIG. 3, a stress (material) layer 130 is next formed both on surfaces of the fins 110 and the top surface 101 of the substrate 110, for example through a deposition process or an epitaxial growing process. Preferably, the stress (material) layer 130 includes a germanium-containing layer which may create a proper stress as well as a better lattice structure, wherein the germanium-containing layer for example includes germanium (Ge), silicon germanium (SiGe) or the like, but not limited thereto. As an example, the stress (material) layer 130 may include silicon germanium or germanium while the substrate 100 and the fins 110 include silicon, so as to improve the lattice structure of the substrate 110 and the fins 110. However, in other embodiments, the stress (material) layer 130 may include other material for creating proper stress and improved lattice structure, such as carbide (C), silicon carbide (SiC) or the like. Furthermore, the stress (material) layer 130 includes a relative smaller thickness T1 with respected to that of the substrate 100, for example the thickness T1 may be about 1 angstrom to 10 nanometers, but is not limited thereto.

Then, as shown in FIG. 4, a shallow trench isolation 150 is formed on the substrate 100 to cover the stress (material) layer 130, with the shallow trench isolation 150 surrounding each of the fins 110. In one embodiment, the shallow trench isolation 150 may be formed through at least one deposition process and a planarization process, in which, a first isolating material layer (not shown in the drawings) may be firstly deposited on the substrate 100 to at least fill up the trenches 102 having the relative smaller diameter G1, a second isolating material layer (not shown in the drawings) may be next deposited on the first isolating material layer to fill up the trenches 102 having the relative greater diameter G2, and an etching back process or a chemical mechanical polishing/planarization (CMP) process may be performed to remove the second isolating material layer and the first isolating material layer disposed on top surface of the fins 110, thereby forming the shallow trench isolation 150 being coplanar with the top surface of the fins 110, as shown in FIG. 4. People in the art should fully realize that the shallow trench isolation 150 may also be formed through other processes such as an atomic layer deposition (ALD) process or an in-situ steam generation (ISSG) process, due to practical product requirements.

The first isolating material layer and the second isolating material layer for example include a dielectric material, such as silicon oxide ($SiO_x$), silicon nitride (SiN), silicon oxynitride (SiON) or silicon carbonitride (SiCN), and the materials of the first isolating material layer and the second isolating material layer may be optionally the same or different from each other. Preferably, the materials of the first isolating material layer and the second isolating material layer are different, for example including silicon oxide and silicon nitride respectively, but not limited thereto. Accordingly, the shallow trench isolation 150 disposed within the trenches 102 having the relative greater diameter G2 may have a multilayer structure, with the multilayer structure including a first isolating layer (including silicon oxide) 151 and a second isolating layer (including silicon nitride) 153 stacked from bottom to top, and the shallow trench isolation 150 disposed within the trenches 102 having the relative smaller diameter G1 may have a monolayer structure only including the first isolating layer 151, as shown in FIG. 4. However, in another embodiment, the same dielectric material with different densities or more diverse dielectric materials may also filled in the trenches 102 to form the shallow trench isolation with a partial multilayered structure and a partial monolayer structure.

Figure 6:
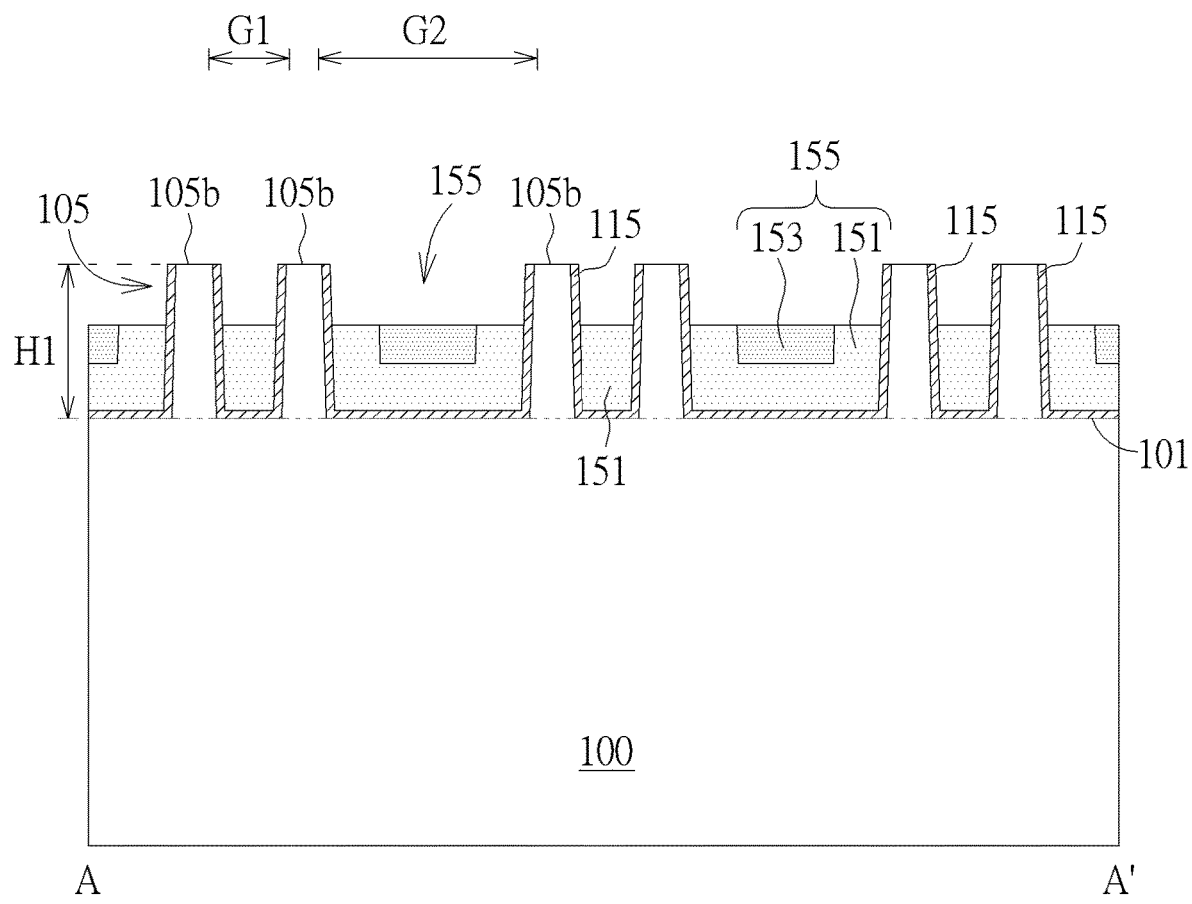

Next, as shown in FIGS. 5-7, at least one trench 105 is formed along the direction D2, to cross the fins 110. People in the art should easily realize the precise number of the trench 105 may be diverse based on practical product requirements, such as being five as shown in FIG. 5, but is not limited thereto. In one embodiment, each of the trenches 105 is parallel with each other along the direction D2 to penetrate through multiple fins 110 extended in the direction D1 at the same time, and each of the fins 110 may be penetrated by two trenches 105 at the same time, if being seen from a top view shown in FIG. 5, but not limited thereto. The formation of the trenches 105 may be carried out by first providing a mask (not shown in the drawings) on the substrate 100, with the mask having at least one opening (not shown in the drawings) partially exposing the fins 110 and the shallow trench isolation 150, and performing at least one etching process to partially remove the exposed portions of fins 110 and the shallow trench isolation 150, to form the trenches 105 thereby. Accordingly, each of the trenches 105 may simultaneously pass through the shallow trench isolation 150 and the fins 110, to form fins 115 and shallow trench isolation 155 both having reduced heights within the trenches 105, as shown in FIGS. 5-6. As shown in FIG. 7, the fins 115 is formed from etched portions of the fins 110, and the maximum height H1 of the fins 115 is obvious smaller than the maximum height H2 of the fins 110, wherein the maximum heights H1, H2 of the fins 115 and the fins 110 may be regarded as the distances between the top surfaces of the fins 115 and the fins 110 and the top surface 101 of the substrate 100.

It is noted that, different etching degrees may be presented on the fins 110 and the shallow trench isolation 150 during the etching process, because the etching rate is differ by the materials of the fins 110 and the shallow trench isolation 150. Thus, bottom walls of each trench 105 which are located at the fins 115 and at the shallow trench isolation 155 may not be coplanar, for example, the top surface of the fins 115 may be relative higher than that of the shallow trench isolation 155 as shown in FIG. 6. It is also noted that, the stress (material) layer 130 disposed over the exposed portions of fins 110 is also removed during the etching process, thereby forming the stress layer 130 that directly expose the top surface of each fin 115 as shown in FIG. 6. In other words, after the etching process, the stress layer 130 covers both of the top surface and lateral surface of each fin 110 as shown in FIG. 7, and the stress layer 130 only covers lateral surface of each fin 115 as shown in FIG. 6, with the portion of each trench 105 located at the fins 110 having the exposed sidewalls 105a and the exposed bottom walls 105b (namely the top surface of the fins 115).

Following these, as shown in FIG. 8, an oxidation process for example an ALD process or an ISSG process is performed on all exposed surfaces of the fins 110, 115, to form an oxide layer 170. Precisely, the oxide layer 170 is formed by synchronously consuming the exposed surface underneath, and thus a portion of the oxide layer 171 which is disposed on the lateral surface of each fin 115 and directly in contact with the stress layer 130 may include the same element of the stress layer 130. For example, while the stress layer 130 includes silicon germanium or germanium, and the portion of the oxide layer 171 may include $SiGeO_x$ or $GeO_x$, but not limited thereto. On the other hand, another portion of the oxide layer 173 disposed on the top surface 105b of each fin 115 and directly in contact with the fins 115 may include the same element of the fins 115, for example including silicon oxide ($SiO_x$) while the fins 115 including silicon or silicon-containing materials, but not limited thereto. Likewise, although not being shown in FIG. 8, another portion of the oxide layer (not shown in the FIG. 8 but shown in FIG. 11) 171 disposed on the top surface of each fin 110 may also include the same element of the stress layer 130 underneath, and a material thereof may therefore be silicon germanium oxide or germanium oxide; and another portion of the oxide layer (not shown in the FIG. 8 but shown in FIG. 11) 173 disposed on the exposed sidewalls 105a of each trench 105 may also include the element of the fins 110, and a material thereof may therefore be silicon oxide, but is not limited thereto.

It is noted that due to the material differences between different portions of the oxide layer 170 (namely the portion of the oxide layer 171 and the another portion of the oxide layer 173), the oxide layer 170 may include different thicknesses among different portions, for example with the portion of the oxide layer 171 (for example including $GeO_x$ or $SiGeO_x$) having a relative greater thickness T2 with respect to a thickness T3 of the another portion of the oxide layer 173 (for example including $SiO_x$), but not limited thereto. Also, after the oxidation process, the stress layer 130 underneath may therefore include different element concentrations among different portions. For example, if the stress layer 130 includes SiGe or Ge, various portions of the stress layer 130 may include different Ge concentration after the oxidation process, with the stress layer 130 disposed under the oxide layer 170 (namely the portion of the oxide layer 171) having a relative less concentration of Ge with respect to that of the stress layer 130 disposed under the shallow trench isolation 155.

Figure 10:
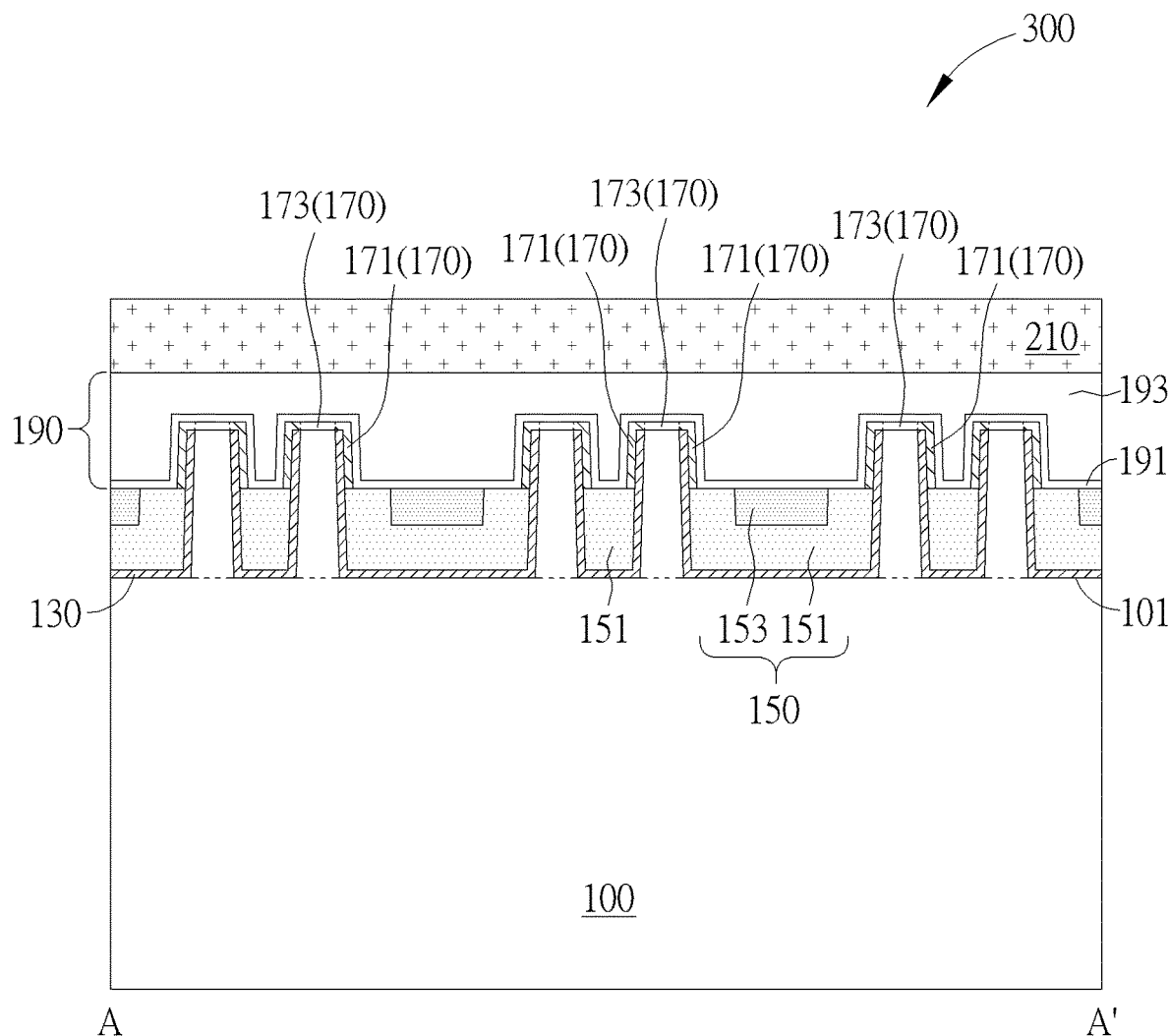
Figure 11:
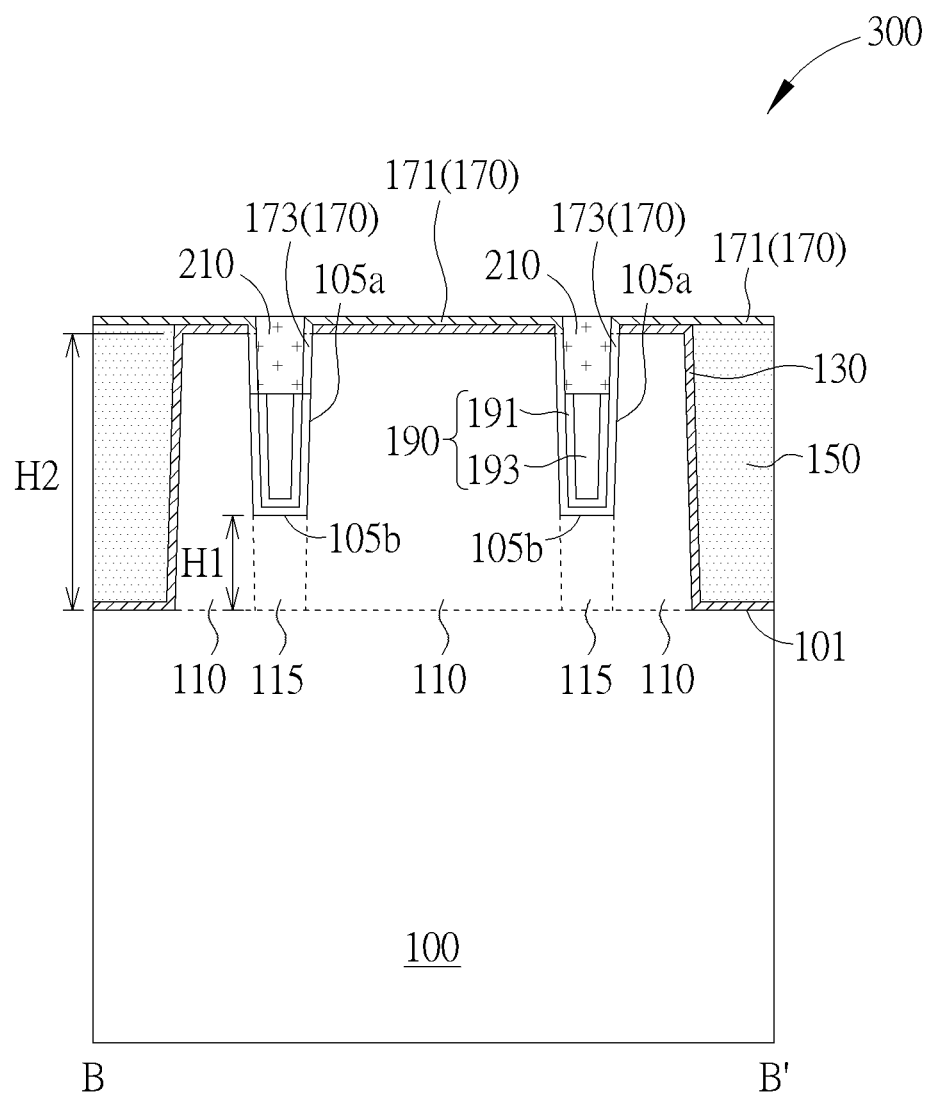

After that, as shown in FIGS. 9-11, at least one gate structure 190 is formed within the trench 105 to fill up the bottom portion of the trench 105, and a cover layer 210 is then formed on the gate structure 190 to fill the rest portion of the trench 105. People in the art should easily realize the precise number of the gate structure 190 may be in accordance with the practical number of the trenches 105, such as also being five as shown in FIG. 9, but is not limited thereto. As shown in FIGS. 10-11, each of the gate structures 190 extends along the direction D2 to cross over the fins 115 and the shallow trench isolation 155, and which further includes a gate dielectric layer 191 and a gate electrode layer 193 stacked from bottom to top within each trench 105. In one embodiment, the gate structures 190 may be formed by conformally forming a dielectric layer (not shown in the drawings, for example including silicon oxide, silicon nitride or other suitable dielectric materials) on the substrate 100 to at least cover surfaces of each trench 105, next forming a conductive layer (not shown in the drawings) on the dielectric layer to at least fill up each trench 105, with the conductive layer for example including a low resistant metal like tungsten (W), aluminum (Al) or copper (Cu), performing an etching back process to partially remove the conductive layer and the dielectric layer filled in each trench 105, thereby forming the gate dielectric layer 191 and the gate electrode layer 193, and then, forming the cover layer 210 on the gate structure 190 to fill up each trench 105.

Through these performances, a semiconductor device 300 according to the preferred embodiment of the present disclosure is obtained, and which includes a plurality of gate lines (namely the gate structure 190) embedded within the fins 110 and the shallow trench isolation 150, to perform like a buried gate line respectively. Furthermore, after obtaining the structure as shown in FIGS. 9-11, a plurality of conductive lines (not shown in the drawings) and at least one capacitor (not shown in the drawings) may further be formed over the top surface of the fins 110, and thus that the semiconductor device 300 may therefore serve as a memory device like a dynamic random access memory (DRAM) device, with each of the gate structures 190 being functioned like a word line (WL) and with each of the conductive lines being functioned like a bit line (BL) for accepting and delivering signals in the DRAM array during the operation. However, in another embodiment, other active elements may also be formed over the fins 110 in the subsequent processes, and the semiconductor device 300 may therefore serve as other semiconductor memory device to execute various functions or performances.

Further in view of FIGS. 9-11, the semiconductor device 300 according to the preferred embodiment of the present disclosure includes at least one trench 105 penetrates through the fins 110 and the shallow trench isolation 150, and at least one gate line (namely the gate structures 190) burial disposed in the bottom portion of the at least one trench 105 to cross over the fins 115 and the shallow trench isolation 155 with reduced heights. As being seen from a cross-section view shown in FIG. 11, the fins 110 are disposed at two sides of the fins 115 and the fins 110, 115 are both surrounded by the shallow trench isolation 150, with the maximum height H2 of the fins 110 being greater than the maximum height H1 of the fins 115. Precisely, the at least one gate line includes the gate dielectric layer 191 and the gate electrode layer 193 stacked from bottom to top, wherein the gate dielectric layer 191 is disposed between the fins 115 and the gate electrode layer 193 and which may include an U-shaped structure through a cross-sectional view shown in FIG. 11. Also, the semiconductor device 300 includes the stress layer 130 disposed on the lateral surfaces of the fins 115 and the top surface 101 of the substrate 100. The stress layer 130 preferably includes a germanium-containing layer which may create a proper stress as well as a better lattice structure, and the germanium-containing layer preferably includes a material which is different from that of the substrate 100, such as including germanium, silicon germanium, or the like. In this way, the channel of the at least one gate line may therefore obtain a suitable stress and better lattice structure, so as to improve the electron-mobility for driving currents and performances thereby. Furthermore, the stress layer 130 is also disposed on the top surface and the lateral surface of the fins 110 as shown in FIG. 11 because of the formation of the stress layer 130 being prior than the formation of the shallow trench isolation 150, and the Ge concentration within the stress layer 130 may be differ by different distributed portions, such as being relative lower concentration in the upper portion and being relative high concentration or without any remaining in the bottom portion.

In additional, the semiconductor device 300 further includes the oxide layer 170 which is formed by synchronously consuming the exposed surface underneath, such as the stress layer 130 or the exposed surfaces of fins 110/115. Accordingly, a portion of the oxide layer 171 may also include Ge, and which is disposed on the lateral surface of the fins 115, as well as the top surface of the fins 110, to have an L-shaped structure as shown in FIG. 11. On the other hands, another portion of the oxide layer 173 may also include Si, and which is disposed on the top surface of the fins 115 (also known as the bottom wall of the trenches 105), as well as the sidewalls of the trenches 105, to form an U-shaped structure within each trench 105, between the gate structure 190 and the fins 110/115 as shown in FIGS. 10-11. In this way, different portions of the oxide layer 170 (namely the portion of the oxide layer 171 and the another portion of the oxide layer 173) may include different materials, as well as different thicknesses T2, T3. In one embodiment, the portion of the oxide layer 171 may include silicon germanium oxide or germanium oxide, and the another portion of the oxide layer 173 may include silicon oxide, but not limited thereto.

People well known in the arts should easily realize the semiconductor device and the forming method thereof in the present disclosure is not limited to the aforementioned embodiment, and which may further include other examples or variety. The following description will detail the different embodiments of the semiconductor device and the forming method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 12:
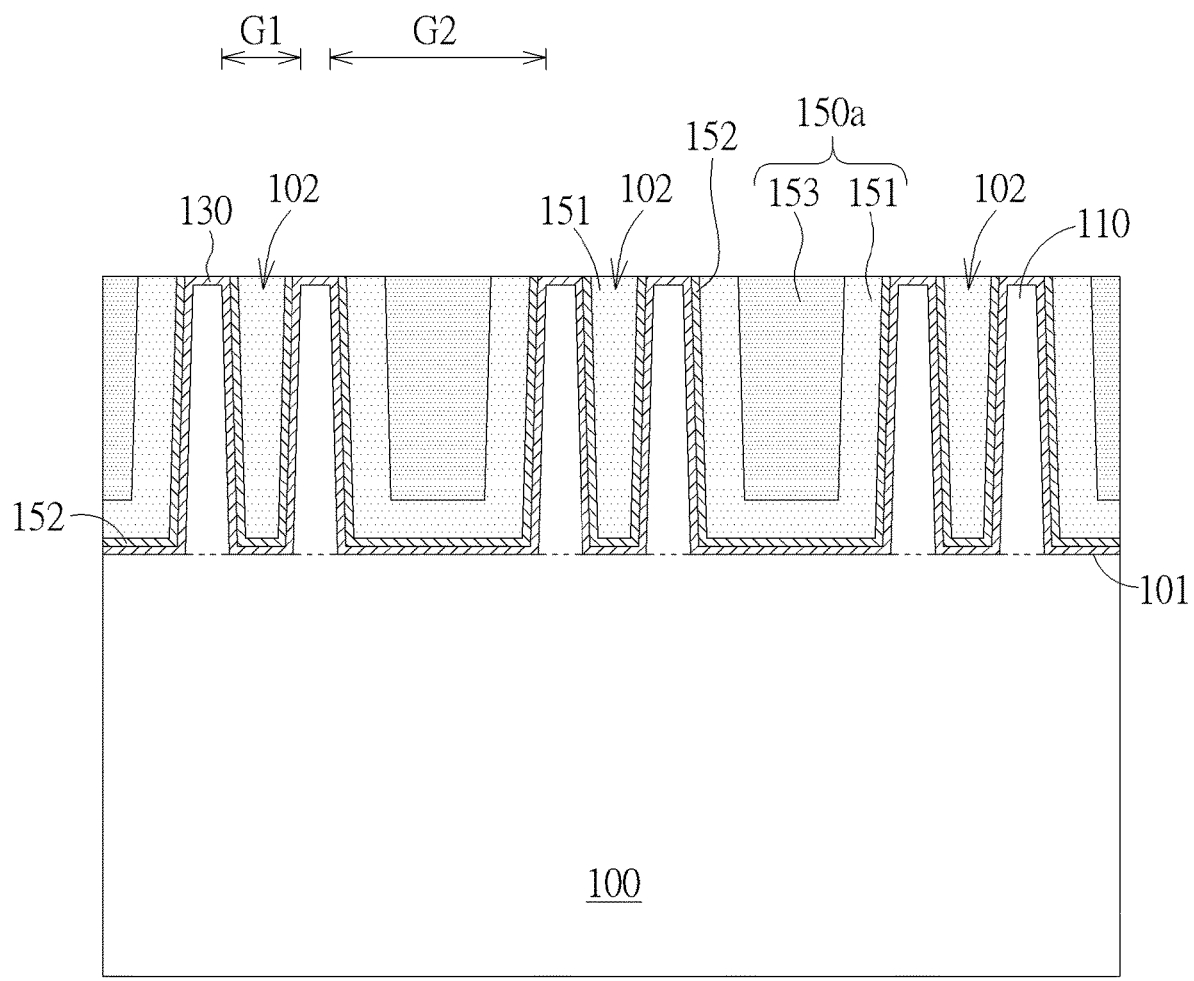
Figure 13:
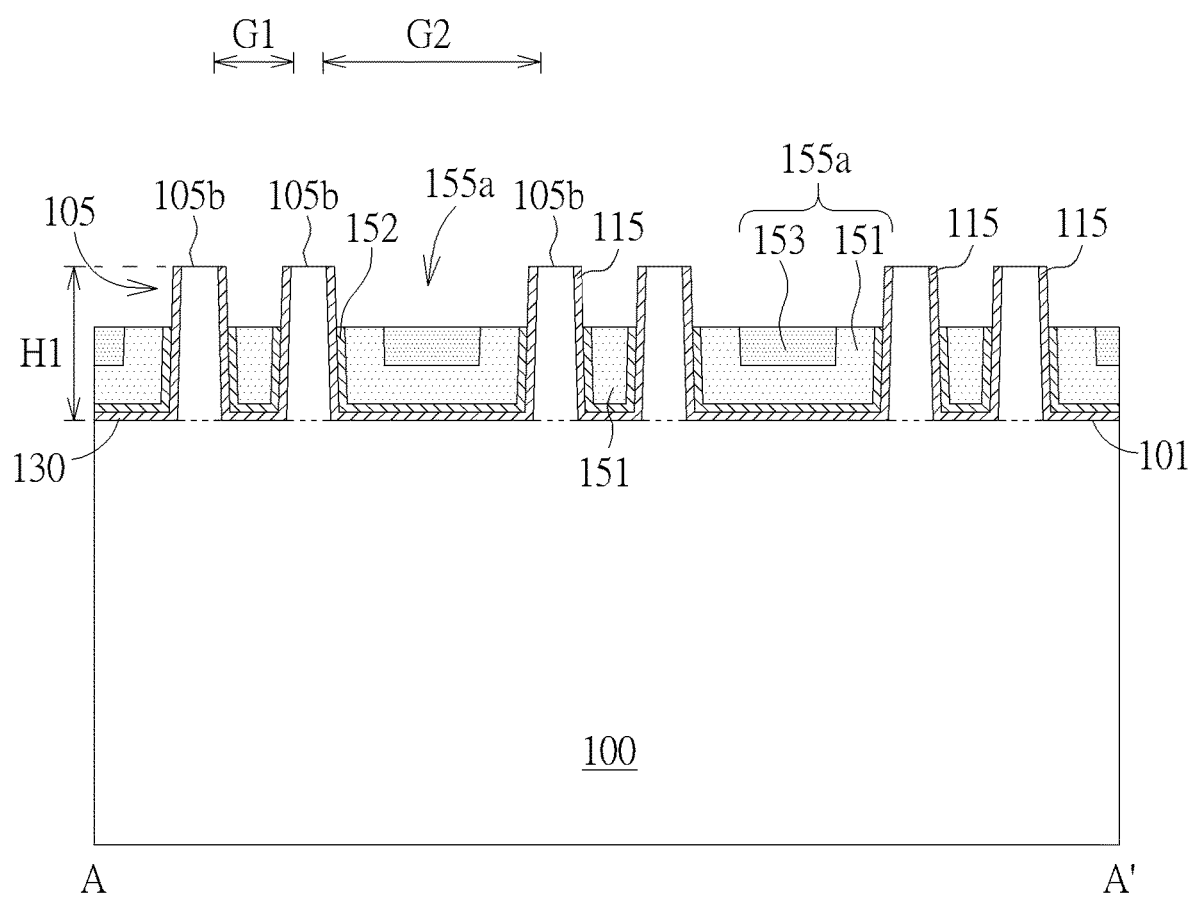
Figure 14:
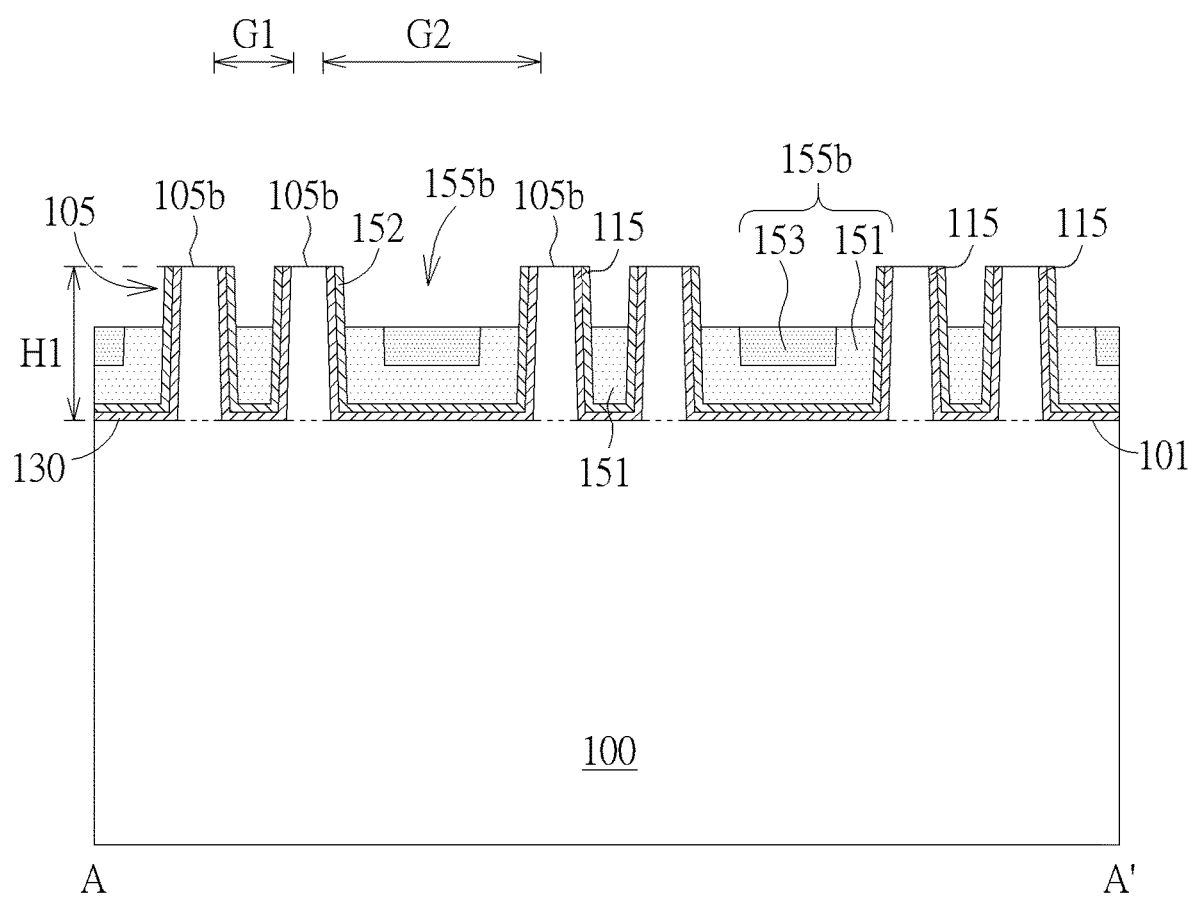
FIG. 14 shows another cross-sectional view of a semiconductor after forming a trench.

Please refer to FIGS. 12-13, which illustrate a method of forming a semiconductor device according to the second preferred embodiment of the present disclosure. The formal steps of the present embodiment are substantially the same as those of the aforementioned first embodiment, and which may not be redundantly described hereinafter. The difference between the aforementioned first embodiment and the present embodiment is in that partial portions of a shallow trench isolation 150a of the present embodiment includes a triple-layered structure including an oxide layer 152, the first isolating layer 151 and the second isolating layer 153. As shown in FIG. 12, the oxide layer 152 is formed through an ALD process or an ISSG process, and at least a portion of element (such as Ge, SiGe) within the stress layer 130 is consumed and oxidized to form the oxide layer 152 (for example including $GeO_x$, $SiGeO_x$). After that, the trench 105 is formed by partially removing the fins 110 and the shallow trench isolation 150a (including the oxide layer 152, the first isolating layer 151 and the second isolating layer 153), and also, the fins 115 and a shallow trench isolation 155a both having reduced heights are formed thereby, as shown in FIG. 13. Then, similar to FIGS. 7-11 of the aforementioned first embodiment, the oxide layer 170, and the gate structure 190 may be further formed in the subsequent processes to cross over the fins 115. However, in another embodiment, the oxide layer 152 and the isolating layers (including the first isolating layer 151 and the second isolating layer 153) may have various etching degrees while forming the trench 105, and accordingly, the fins 115 and a shallow trench isolation 155b are formed, wherein the oxide layer 152 is remained on entire lateral surfaces of the fins 155, to partially protrude from the top surfaces of the first isolating layer 151 and the second isolating layer 153, as shown in FIG. 14. In the another embodiment, an oxide layer (not shown in the drawings) formed in the subsequently oxidation process may be disposed over the oxide layer 152 which is protruded from the top surfaces of the first isolating layer 151 and the second isolating layer 153, and which may be optionally merged with the oxide layer 152.

Through these performances, the semiconductor device formed in the present embodiment includes a germanium-containing layer (such as the stress layer 130, the oxide layer 171 or the oxide layer 152) disposed on lateral surfaces of fins 115 to provide proper stress and improved lattice structure to the channel thereof. Then, the semiconductor device of the present embodiment is allowable to gain greater electron-mobility, achieving better functions and performances.

Figure 15:
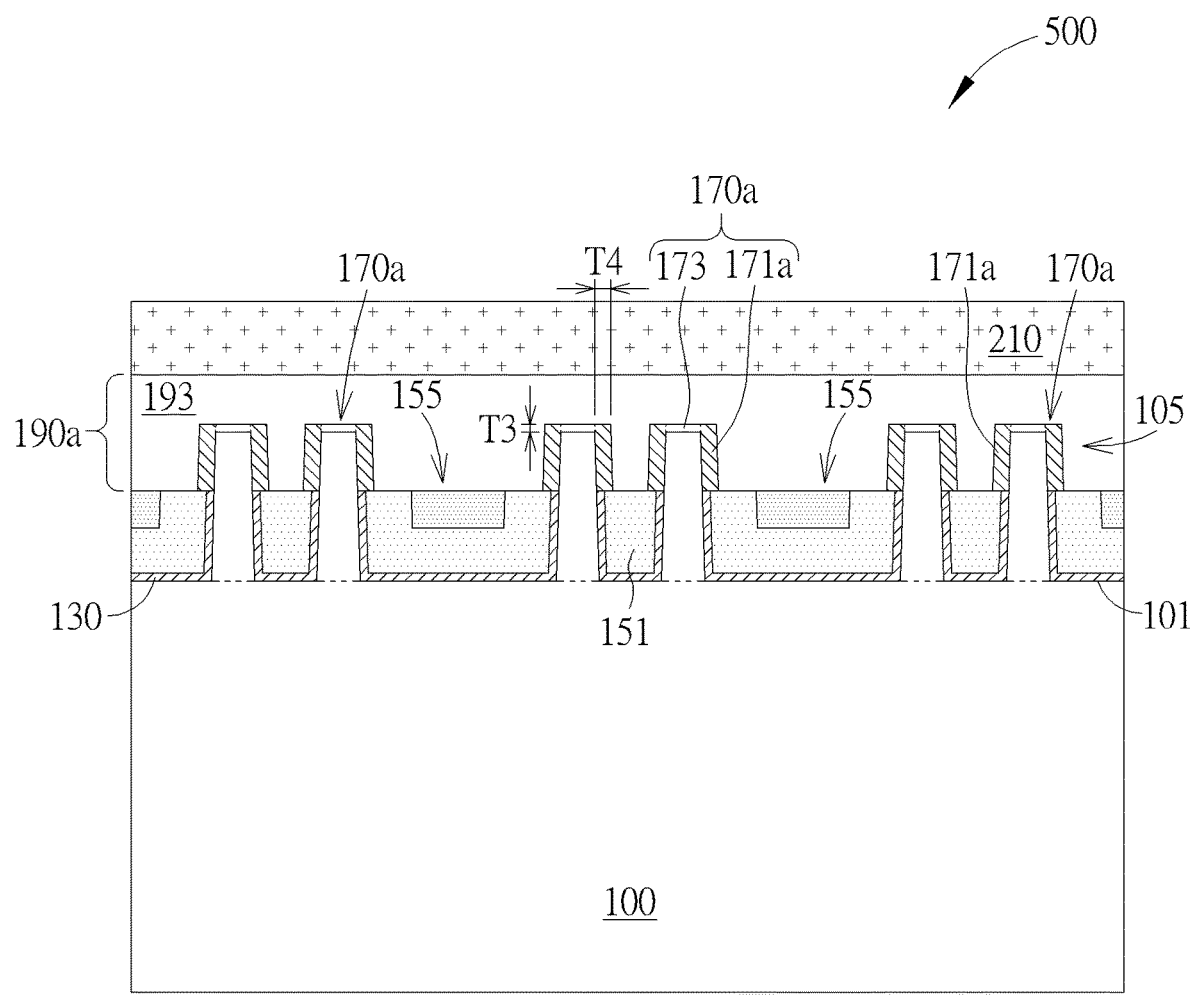
FIG. 15 is a schematic diagram illustrating a method of forming a semiconductor device according to a third preferred embodiment of the present disclosure.

Please refer to FIG. 15, which illustrate a method of forming a semiconductor device 500 according to the third preferred embodiment of the present disclosure. The formal steps of the present embodiment are substantially the same as those of the aforementioned first embodiment, and which may not be redundantly described hereinafter. The difference between the aforementioned first embodiment and the present embodiment is in that a portion of the oxide layer 171*a* in the present embodiment is formed by completely consuming and oxidizing the stress layer 130 underneath, so as to obtain a greater thickness T4. Accordingly, the oxide layer 170*a* of the present embodiment includes a first portion 173 directly disposed on the top surface of the fins 115, and a second portion 171*a* directly disposed on the lateral surfaces of fins 115, as shown in FIG. 15, wherein the first portion 173 and the second portion 171*a* of the oxide layer 170 include different materials and thicknesses T3, T4. In the present embodiment, the first portion 173 for example includes silicon oxide, and the second portion 171*a* for example includes $GeO_x$ or $SiGeO_x$, but not limited thereto. Following these, the gate electrode layer 193 is formed to fill up the bottom portion of the trench 105, and the cover layer 210 is then formed on the gate electrode layer 193 to fill the rest portion of the trench 105. Then, the gate electrode layer 193 and the oxide layer 170*a* may together form a gate structure 190*a*. In other words, the gate dielectric layer 191 of the aforementioned first embodiment is omitted in the present embodiment, and the oxide layer 170*a* formed in the present embodiment is disposed between the gate electrode layer 193 and the fins 115 to function like a gate dielectric layer of the gate structure 190*a*.

Through these performances, the semiconductor device 500 formed in the present embodiment also includes a germanium-containing layer (such as the oxide layer 171*a*) disposed on lateral surfaces of fins 115 to provide proper stress and improved lattice structure to the channel thereof. Then, the semiconductor device 500 of the present embodiment is also allowable to gain greater electron-mobility, achieving better functions and performances.

Overall speaking, the semiconductor device of the present disclosure includes a germanium-containing layer disposed on lateral surfaces of fins, and a gate line crosses over the fins, with the germanium-containing layer creating a proper stress and better lattice structure to the channel thereof. The germanium-containing layer for example includes Ge, SiGe, $GeO_x$, $SiGeO_x$, or other suitable material, and accordingly, the semiconductor device of the present disclosure may be allowable to obtain greater electron-mobility, gaining better functions and performances.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate, having a plurality of fins protruded from the substrate;
   a gate line crossed over ones of the fins, the gate line comprising:
      a gate electrode layer; and
      a gate dielectric layer disposed between the gate electrode layer and the ones of the fins;
   a stress layer disposed on lateral surfaces of each of the fins and on a top surface of the substrate, wherein a material of the stress layer is different from a material of the fins and the stress layer comprises a mono-material and continuously extends from the top surface of the substrate to the lateral surfaces of the fins;
   a shallow trench isolation disposed on the substrate, adjacent to the fins, wherein the shallow trench isolation is disposed on the stress layer disposed on the top surface of the substrate; and
   an oxide layer disposed between the gate dielectric layer and the ones of the fins, wherein the oxide layer directly contacts the ones of the fins and partially covering the stress layer and the shallow trench isolation.

2. The semiconductor device accordingly to claim 1, wherein the oxide layer comprises a first portion and a second portion, the first portion is disposed on top surfaces of the ones of the fins, and the second portion is disposed on the lateral surfaces of the ones of the fins.

3. The semiconductor device accordingly to claim 2, wherein the first portion and the second portion comprise different materials.

4. The semiconductor device accordingly to claim 2, wherein the first portion and the second portion comprise different thicknesses.

5. The semiconductor device accordingly to claim 2, wherein the second portion directly contacts the stress layer disposed on the lateral surfaces of the ones of the fins, and the first portion directly contacts the top surface of the ones of the fins.

6. The semiconductor device accordingly to claim 2, wherein the second portion comprises a same element as the stress layer.

7. The semiconductor device accordingly to claim 1, each of fins further comprising:
   a first portion and a second portion, wherein a maximum height of the second portion of each of the fins is greater than a maximum height of the first portion of each of the fins.

8. The semiconductor device accordingly to claim 6, wherein the stress layer comprises silicon germanium or germanium.

* * * * *